(12) United States Patent
Segawa et al.

(10) Patent No.: US 6,492,672 B1
(45) Date of Patent: Dec. 10, 2002

(54) SEMICONDUCTOR DEVICE

(75) Inventors: Mizuki Segawa, Osaka (JP); Toshiki Yabu, Osaka (JP); Takashi Uehara, Osaka (JP); Takashi Nakabayashi, Osaka (JP); Kyoji Yamashita, Osaka (JP); Takaaki Ukeda, Osaka (JP); Masatoshi Arai, Nara (JP); Takayuki Yamada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 66 days.

(21) Appl. No.: 09/629,861

(22) Filed: Aug. 1, 2000

Related U.S. Application Data

(62) Division of application No. 09/192,536, filed on Nov. 17, 1998, now Pat. No. 6,124,160, which is a division of application No. 08/716,571, filed on Sep. 18, 1996, now Pat. No. 5,879,983.

(30) Foreign Application Priority Data

Sep. 19, 1995 (JP) ................................. 7-239564

(51) Int. Cl.[7] ...................... H01L 27/108; H01L 29/76; H01L 29/94; H01L 31/119
(52) U.S. Cl. .................. 257/296; 257/532; 438/384; 438/238; 438/239; 438/957
(58) Field of Search ............... 257/296, 532; 438/384, 241, 239, 250, 253, 957, 238, 152, 396

(56) References Cited

U.S. PATENT DOCUMENTS

| | | | |
|---|---|---|---|
| 4,367,580 A | | 1/1983 | Guterman |
| 4,577,390 A | * | 3/1986 | Haken .................... 29/570 |
| 4,682,402 A | | 7/1987 | Yamaguchi |
| 5,025,741 A | * | 6/1991 | Suwanai et al. ............. 438/52 |
| 5,185,689 A | | 2/1993 | Maniar |
| 5,187,122 A | * | 2/1993 | Bonis ..................... 438/200 |
| 5,356,826 A | | 10/1994 | Natsume |

(List continued on next page.)

FOREIGN PATENT DOCUMENTS

| | | |
|---|---|---|
| EP | 0 435 534 | 7/1991 |
| JP | 3-214726 | 9/1991 |
| JP | 4-237166 | 8/1992 |

OTHER PUBLICATIONS

"Substrate Contact in a Trench Structure", IBM Technical Disclosure Bulletin, vol. 27, No. 5, pp. 3036–3037 (Oct. 1984).

*Primary Examiner*—David Nelms
*Assistant Examiner*—Andy Huynh
(74) *Attorney, Agent, or Firm*—McDermott, Will & Emery

(57) ABSTRACT

A MOS transistor includes a gate oxide film, and a gate electrode which is formed by a lamination of first and second conductor films. A capacitive element includes a lower capacitive electrode formed of the first conductor film, a capacitive film made of an insulating film which is different from the gate oxide film, an upper capacitive electrode formed of the second conductor film on the capacitive film, and a leading electrode of the lower capacitive electrode formed of the second conductor film. At the same number of steps as in the case where the gate oxide film is used as the capacitive film, a semiconductor device can be manufactured with the capacitive film provided, the capacitive film being made of a nitride film or the like that is different from the gate oxide film. Consequently, a capacitive film having a great capacitance value per unit area is used so that the occupied area can be reduced and an increase in manufacturing cost can be controlled. In the semiconductor device in which a transistor, a capacitive element, a resistive film and the like are provided, the occupied area can be reduced and the manufacturing cost can be cut down.

11 Claims, 8 Drawing Sheets

U.S. PATENT DOCUMENTS

| | | | |
|---|---|---|---|
| 5,397,729 A | * 3/1995 | Kayanuma et al. ........... 438/42 |
| 5,500,387 A | 3/1996 | Tung et al. |
| 5,585,303 A | 12/1996 | Hong et al. |
| 5,591,658 A | 1/1997 | Cacharelis |
| 5,614,431 A | 3/1997 | DeBrosse |
| 5,618,749 A | 4/1997 | Takahashi et al. |
| 5,683,931 A | 11/1997 | Takahashi |
| 5,716,863 A | 2/1998 | Arai |
| 5,759,887 A | 6/1998 | Ito et al. |
| 5,792,683 A | 8/1998 | Hayashi et al. |
| 5,885,862 A | 3/1999 | Jao et al. |
| 5,970,338 A | 10/1999 | Tempel |

* cited by examiner

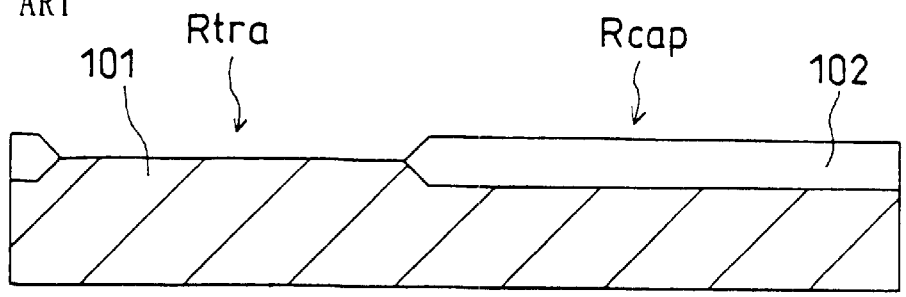
FIG. 8(a) PROIR ART
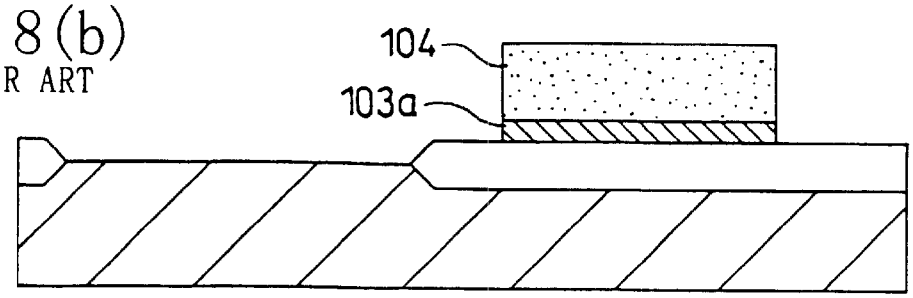
FIG. 8(b) PROIR ART
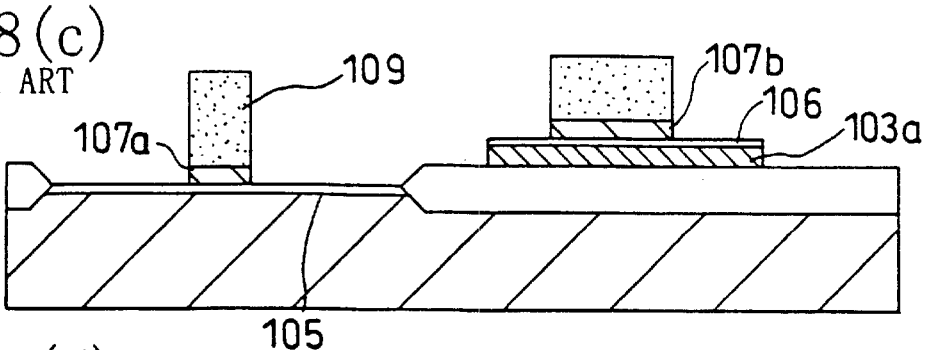
FIG. 8(c) PROIR ART
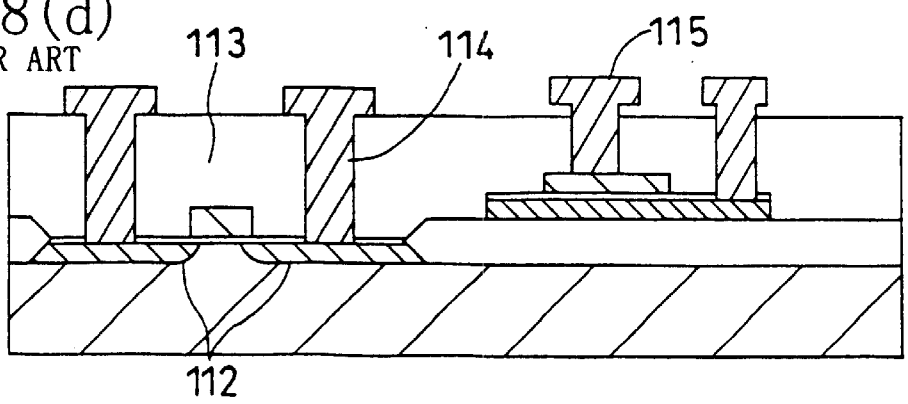
FIG. 8(d) PROIR ART

US 6,492,672 B1

SEMICONDUCTOR DEVICE

This application is a Divisional of application Ser. No. 09/192,536 filed Nov. 17, 1998, U.S. Pat. No. 6,124,160 which is a Divisional of application Ser. No. 08/716,571, filed Sep. 18, 1996, now U.S. Pat. No. 5,879,983.

BACKGROUND OF THE INVENTION

The present invention relates to a semiconductor device in which a capacitive element, a resistor and a transistor are provided.

The (analog-digital) semiconductor device in which a capacitive element and a resistive element are provided in addition to a MOS transistor according to the prior art has been implemented by adding the steps of manufacturing the capacitive element and the resistive element (analog) to the steps of manufacturing an ordinary MOS transistor (digital). In this case, it is desirable that a capacitive element having a great capacitance value per unit area should be formed in order to reduce the area occupied by the capacitive element.

The structure and manufacturing steps of a semiconductor device in which the MOS transistor and a two-layer polysilicon type capacitive element are provided according to the prior art will be described below. FIGS. 8(a) to 8(d) are sectional views showing the manufacturing steps of a semiconductor device in which an n-channel type MOS transistor and a two-layer polysilicon type capacitive element are provided.

As shown in FIG. 8(a), a LOCOS isolation 102 is formed on a part of a p well 101 of a silicon substrate. A region where the surface of the p well 101 is exposed is a region Rtra where a transistor is to be formed. A region Rcap where a capacitive element is to be formed is provided on the LOCOS isolation 102.

As shown in FIG. 8(b), a polysilicon film is deposited in a thickness of 200 nm, for example. Then, a first conductor film into which an impurity is introduced (not shown) by a $POCl_3$ diffusion method or the like is deposited to form a first resist film 104 having a desired pattern. Thereafter, the first conductor film is patterned by a dry etching method to form a lower capacitive electrode 103a.

As shown in FIG. 8(c), a gate oxide film 105 is formed by pyrogenic oxidation in a thickness of 10 nm, for example. At this time, an oxide film is simultaneously formed on the lower capacitive electrode 103a in a thickness of about 20 nm to be a capacitive film 106 (which has a greater thickness than that of the gate oxide film 105 because polysilicon is oxidized more quickly than single crystal silicon). Then, a second conductor film (not shown) made of a polysilicon film having a thickness which is almost the same as that of a first conductor film 103a is formed on the LOCOS isolation 102, the gate oxide film 105 and the capacitive film 106. Consequently, a second resist film 109 having a desired pattern is formed on the second conductor film. By using the second resist film 109 which covers a part of the region Rtra and a part of the first conductor film 103a of the region Rcap, a second conductor film is patterned by the dry etching method to form a gate electrode 107a in the region Rtra and an upper capacitive electrode 107b on the capacitive film 106 in the region Rcap, respectively.

As shown in FIG. 8(d), an n-type impurity is introduced into the p well 101 to form a source-drain region. Then, a layer insulating film 113, a contact hole 114 and a metal wiring layer 115 are successively formed. Thus, a semiconductor device in which the n-channel transistor and the two-layer polysilicon type capacitive element are provided is manufactured.

However, the capacitive film of the capacitive element is formed at the steps shown in FIGS. 8(a) to 8(d) simultaneously with the formation of the gate oxide film of the MOS transistor. For this reason, the capacitance value per unit area is defined by the material and the thickness of the gate oxide film. Since the capacitance value per unit area of the silicon oxide film is small, it is difficult to increase only the capacitance value per unit area of the capacitive film of the capacitive element. In addition, the capacitive film is formed by the oxidation of the polysilicon. The speed at which the polysilicon is oxidized is higher than the speed at which a silicon single crystal is oxidized. Consequently, the thickness of the capacitive film is much greater than that of the gate oxide film. Accordingly, the capacitance value per unit area of the capacitive film becomes small. For this reason, it is difficult to reduce the occupied area.

Also in e case where two-layer polysilicon is used, the gate oxide film and the capacitive film of the capacitive element can be formed of an insulating film having a different material as a method other than the method shown in FIGS. 8(a) to 8(d). In this case, a silicon nitride film which is separately deposited in place of the oxide film is patterned to be the capacitive film 106 in the state shown in FIG. 8(c). At this time, the capacitance value per unit area is not defined by the material and the thickness of the gate oxide film. Consequently, it is possible to reduce the occupied area. However, it is necessary to separately add the step of forming an etching mask for patterning the silicon nitride film. For this reason, the number of manufacturing steps is increased so that the whole manufacturing cost is raised.

As a variant of the above-mentioned method, there is also a method in which a gate oxide film is formed, a conductor film is deposited as the gate electrode of a transistor and the lower capacitive electrode of a capacitive element, and a silicon nitride film or the like is formed on the conductor film. A conductor film on which a silicide film having a low resistance is laminated is used for the gate electrode. However, in the case where the silicide film or the like is used for the lower capacitive electrode, the voltage withstanding properties and the reliability of the capacitive film formed on the lower capacitive electrode are deteriorated. It is also considered that a silicon nitride film or the like is deposited on the first conductor film 103 a in advance in the state shown in FIG. 8(b). In this case, the silicon nitride film is oxidized when forming the gate oxide film. Consequently, the capacitance value per unit area of the capacitive film is finally reduced.

Furthermore, the following method has also been known well. More specifically, a surface concentration in the vicinity of the gate oxide film of a well of a MOS transistor is controlled to form a MOS transistor of a depression type and a capacitive element made of the gate oxide film is formed simultaneously. In this method, the number of manufacturing steps is hardly increased. However, the capacitance value per unit area is comparatively small so that the area occupied by the capacitive element is increased. Consequently, it is hard to obtain high integration. In addition, the voltage dependency of the capacitance value is increased. For this reason, it is impossible to obtain the precision necessary for the use in an analog circuit.

As described above, the above-mentioned methods have merits and demerits. A device which can meet general requirements such as quality, a reduction in the area and manufacturing cost has not been made for practical use. Also in an analog-digital LSI, more fineness and higher integration have been demanded. Referring to an analog portion, the process for effectively reducing the area and the number of manufacturing steps at the same time has not been proposed and should be developed in order to realize the integration of the analog-digital LSI.

In the prior art, a resistive element is formed of a conductor film (a sheet resistance of 30 to 100 $\Omega/\square$) which is obtained by introducing an impurity into polysilicon by the $POCl_3$ diffusion method or an ion implantation method. A conductor film having a low resistance (a sheet resistance of 5 to 10 $\Omega/\square$) such as polycide which is formed by a lamination of polysilicon and silicide has been used for a gate electrode in such a manner that it can also be used for a local wiring. However, in the case where a certain resistance value is obtained in the resistive element, a conductor film having a is comparatively high resistance value should be used as a resistive film in order to reduce the area of the resistive element. For this reason, it is necessary to form a conductor film as the gate electrode by using a material having a low resistance and to form a conductor film as the resistive film by using a material having a comparatively high resistance without increasing the number of steps.

SUMMARY OF THE INVENTION

It is an object of the present invention to reduce the areas occupied by a capacitive element and a resistive element and to prevent an increase in cost caused by increasing the number of manufacturing steps in a semiconductor device in which two of a transistor, a capacitive element and a resistive element are provided.

The present invention provides a first semiconductor device in which at least a MIS transistor and a capacitive element are provided on a semiconductor substrate. The MIS transistor includes at least a gate insulating film formed on the semiconductor substrate, and a gate electrode formed of a first conductor film and a second conductor film which are laminated on the gate insulating film. The capacitive element includes a lower capacitive electrode formed of the first conductor film, a capacitive film formed on the lower capacitive electrode and made of an insulating film whose material is different from that of the gate insulating film, and an upper capacitive electrode formed on the capacitive film and made of the second conductor film.

According to such a structure, the lower capacitive electrode and the upper capacitive electrode of the capacitive element are formed of the first and second conductor films forming the gate electrode of the MIS transistor. Consequently, the first and second conductor films are patterned so that the gate electrode of the MIS transistor and each electrode of the capacitive element can be formed at the same time. More specifically, it is sufficient that a masking step to form the capacitive film is added as compared with a semiconductor device in which only the MIS transistor is provided. Furthermore, the capacitive film of the capacitive element is made of the insulating film having the material which is different from that of the gate insulating film of the MIS transistor. Consequently, the material having a high capacitance value per unit area can be used so that the area occupied by the capacitive element can be reduced. Accordingly, the semiconductor device in which the MIS transistor and the capacitive element having the small occupied area are provided can be obtained at low cost by using the two-layer polysilicon process.

The present invention provides a second semiconductor device in which at least a MIS transistor and a resistive element are provided on a semiconductor substrate. The MIS transistor includes at least a gate insulating film formed on the semiconductor substrate, and a gate electrode formed of a first conductor film and a second conductor film which are laminated on the gate insulating film. The resistive element includes a resistive film made of the first conductor film, an etching protection film formed in a region other than both ends of the resistive film and made of an insulating film whose material is different from that of the gate insulating film, and two leading electrodes formed over a portion from both ends of the etching protection film to the resistive film on the outside thereof, and made of the second conductor film.

According to such a structure, the etching protection film is formed on the resistive film of the resistive element. Consequently, the leading electrodes on both ends of the resistive film and the resistive film of the resistive element can be etched at the same time. In addition, the first and second conductor films forming the gate electrode of the MIS transistor are formed of the conductor film which is common to the resistive film and the leading electrodes of the resistive element. Consequently, the first and second conductor films are patterned so that the gate electrode of the MIS transistor, and the resistive film and the leading electrodes of the resistive element can be formed at the same time. More specifically, it is sufficient that a masking step to form the etching protection film is added as compared with a semiconductor device in which only the MIS transistor is provided. Furthermore, the gate electrode of the transistor has a two-layer structure. For this reason, if the resistance value of the second conductor film which is an upper layer is decreased, the resistance value of the first conductor film which is a lower layer may be increased. Consequently, the resistivity of the resistive element formed of the first conductor film can be increased so that the area occupied by the resistive element can be reduced. Accordingly, the semiconductor device in which the MIS transistor and the resistive element having the small occupied area are provided can be obtained at low cost by using the two-layer polysilicon process.

The present invention provides a third semiconductor device in which at least a capacitive element and a resistive element are provided on a semiconductor substrate. The capacitive element includes a lower capacitive electrode formed on the semiconductor substrate and made of a first conductor film, a capacitive film formed on the lower capacitive electrode and made of an insulating film, and an upper capacitive electrode formed on the capacitive film and made of the second conductor film. The resistive element includes a resistive film made of the first conductor film, an etching protection film formed on the resistive film and made of an insulating film which is common to the capacitive film of the capacitive element, and two leading electrodes formed over a portion from both ends of the etching protection film to the resistive film on the outside thereof, and made of the second conductor film.

According to such a structure, the etching protection film on the resistive film of the resistive element is formed of the insulating film which is common to the capacitive film of the capacitive element. Consequently, the leading electrodes on both ends of the resistive film and the resistive film of the resistive element can be etched at the same time. In addition, the upper capacitive electrode and the lower capacitive electrode of the capacitive element can be formed at the same time. Consequently, the number of necessary steps can be reduced. In addition, the areas occupied by the capacitive element and the resistive element can be reduced by the above-mentioned functions. Accordingly, the semiconductor device in which the capacitive element and the resistive element having the small occupied areas are provided can be obtained at low cost.

The present invention provides a fourth semiconductor device, in which the first semiconductor device further comprises a resistive element, the resistive element including a resistive film made of the first conductor film, an etching protection film formed on the resistive film and made of an insulating film which is common to the capacitive film of the capacitive element, and two leading electrodes formed over a portion from both ends of the etching protection film to the resistive film on the outside thereof, and made of the second conductor film.

According to such a structure, the above-mentioned functions can also be obtained and the semiconductor device in which the MIS transistor, the capacitive element and the resistive element are provided can be obtained at low cost.

In the first to fourth semiconductor devices, it is preferable that the insulating film should be made of at least one of a silicon nitride film, PZT and a tantalum oxide film.

According to such a structure, it is possible to obtain the capacitive film having a high capacitance value per unit area, and the etching protection film having the high function as the etching stoppers of the first and second conductor films.

The first to fourth semiconductor devices can further comprise an EEPROM memory cell, the EEPROM memory cell including a floating gate electrode formed of the first conductor film, an insulating film on a floating gate made of the insulating film, and a control gate electrode formed on the insulating film on the floating gate, and made of the second conductor film.

According to such a structure, it is possible to obtain the semiconductor device which has applicability enlarged and high functionality.

The present invention provides a first method for manufacturing a semiconductor device in which a capacitive element is provided on a semiconductor substrate, comprising the steps of depositing a first conductor film on the semiconductor substrate intervened by an insulating member, depositing an insulating film on the first conductor film, patterning the insulating film to form a capacitive film of the capacitive element, depositing a second conductor film on the insulating film and the first conductor film, and patterning the first and second conductor films by using an etching mask including at least a part of the capacitive film to form an upper capacitive electrode of the capacitive element by the second conductor film and to form a lower capacitive electrode of the capacitive element by the first conductor film.

According to such a method, the upper and lower capacitive electrodes can simultaneously be formed of the first and second conductor films by using the same etching mask, respectively. Also in the case where the MIS transistor is formed on the same substrate, the gate electrode can be formed by using the first and second conductor films. In addition, the capacitive film is formed on the first conductor film. Consequently, also in the case where the MIS transistor is formed on the same substrate, the step of forming a capacitive film is performed independently of the step of oxidizing a gate. Consequently, the resistive film can be formed by using a material having a high capacitance value per unit area as required. Accordingly, the step of forming a capacitive element can be incorporated by adding a few steps to the process for manufacturing a semiconductor device in which the MIS transistor is provided. Thus, it is possible to obtain the basic process for forming the capacitive element to provide the capacitive element having the small occupied area and various elements together at low cost.

In the first method for manufacturing a semiconductor device, the step of forming the upper capacitive electrode and the lower capacitive electrode is performed by using, as etching masks, a resist film having at least a first region which covers the predetermined region of the capacitive film and a second region which covers a region from an end of the capacitive film to the outside thereof, and the capacitive film to form the upper capacitive electrode made of the second conductor film which is left in the lower portion of the first region, a leading electrode of the lower capacitive electrode made of the second conductor film which is left in the lower portion of the second region, and the lower capacitive electrode made of the first conductor film which is left over a region covered with at least one of the capacitive film and the resist film.

According to such a method, the lower capacitive electrode, the upper capacitive electrode and the leading electrode can simultaneously be formed of the first and second conductor films by etching using the resist film and the capacitive film as etching masks, and it is very easy to realize a reduction in the masking steps and the formation of the capacitive element having the small occupied area.

The present invention provides a second method for manufacturing a semiconductor device in which a resistive element is provided on a semiconductor substrate, comprising the steps of depositing a first conductor film on the semiconductor substrate through an insulating member, depositing an insulating film on the first conductor film, patterning the insulating film to form an etching protection film, depositing a second conductor film on the etching protection film and the first conductor film, and forming a resistive film made of the first conductor film which is left over a region covered with either of the etching protection film and a resist film and forming a leading electrode of the resistive film made of the second conductor film which is left in a region covered with only the resist film by using, as etching masks, the etching protection film and the resist film having two regions which cover a region from both ends of the etching protection film to the outside thereof on the second conductor film.

According to such a method, the resistive film and the leading electrode of the resistive element are simultaneously formed at the steps of etching the first and second conductor films, and the resistive element is formed at a small number of steps. In addition, the resistive film having a small variation in the resistance value is formed because it is covered with the etching protection film when forming the resistive element. Thus, characteristics can be enhanced. Accordingly, it is possible to obtain the basic process for manufacturing the resistive element suitable for the process for the MIS transistor and the like in which the resistive element having excellent characteristics can be manufactured at a smaller number of steps.

The first or second method for manufacturing a semiconductor device can further comprise the step of forming a gate insulating film in an active region of the semiconductor substrate prior to the step of depositing a first conductor film, wherein the first conductor film is deposited also on the gate insulating film at the step of depositing a first conductor film, the insulating film in the active region is removed at the step of patterning an insulating film, the second conductor film is laminated on the first conductor film in the active region at the step of depositing a second conductor film, and a gate electrode made of the first and second conductor films is formed in the active region at the step of patterning the first and second conductor films.

According to such a method, a few masking steps are added to the steps of forming the MIS transistor so that the capacitive element, the resistive element and the MIS transistor are provided on the same semiconductor substrate by the above-mentioned manufacturing method. In particular, the resistive film of the resistive element and the lower layer of the gate electrode of the MIS transistor can be formed of the first conductor film having a high resistance value, and the leading electrode of the resistive element and the upper layer of the gate electrode of the MIS transistor can be formed of the second conductor film having a low resistance value. In addition, etching for patterning the insulating film is performed with the whole semiconductor substrate covered with the first conductor film. Consequently, there is little possibility that the active region of the MIS transistor is contaminated at the etching step. Accordingly, it is possible to manufacture the semiconductor device at low cost in which the capacitive element having the small occupied area, the resistive element having the small occupied area and high characteristics, and the MIS transistor having excellent characteristics are provided.

Furthermore, a part of the insulating film in a part of the active region can be left as an insulating film on a floating gate of an EEPROM at the step of patterning an insulating film, the second conductor film can be laminated on the first conductor film and the insulating film on the floating gate in the part of the active region at the step of depositing a second conductor film, and a control gate electrode of the EEPROM made of the second conductor film which is left below the resist film can be formed by using the resist film which covers a part of the insulating film on the floating gate and a floating gate electrode of the EEPROM made of the first conductor film which is left below the insulating film on the floating gate in the part of the active region at the step of patterning the first and second conductor films. According to such a method, the memory cell of the EEPROM is formed in the semiconductor device simultaneously with the formation of the MIS transistor, the capacitive element, the resistive element and the like. In addition, the special masking step of forming each element of the memory cell of the EEPROM is not necessary. Accordingly, it is possible to manufacture the EEPROM at low cost in which the capacitive element and the resistive element having the small occupied areas are provided.

The first or second method for manufacturing a semiconductor device can further comprise, prior to the step of patterning the insulating film, the steps of forming an element isolating trench by sequentially removing the insulating film, the first conductor film and the semiconductor substrate in a region where an element isolation is to be formed, depositing an insulating film for the element isolation which fills in the element isolating trench and covers the insulating film, and planarizing the insulating film for the element isolation by using the insulating film as a mask.

According to such a method, the element isolating trench having a trench isolation structure is formed by using, as an etching stopper, the insulating film to be the capacitive film of the capacitive element and the resistive film of the resistive element. By adding a few steps, thus, the element isolation having the trench structure with the high element isolating function can be formed on the semiconductor device in which the capacitive element, the resistive element, the MIS transistor, the memory cell of the EEPROM and the like are provided.

BRIEF DESCRIPTION OF THE DRAWINGS

The present invention will be detailed in conjunction with the accompanying drawings wherein:

FIGS. 8(a) to 8(d) are sectional views showing the process for manufacturing a semiconductor device in which a MOSFET and a capacitive element are provided according to the prior art.

DETAILED DESCRIPTION OF THE INVENTION (First Embodiment)

A semiconductor device and a method for manufacturing the semiconductor device according to a first embodiment will be described below with reference to FIGS. 1(a) to 1(d) and FIGS. 2(a) and 2(b). FIGS. 1(a) to 1(d) and FIGS. 2(a) and 2(b) are sectional views showing the steps of manufacturing a semiconductor device in which an n-channel transistor and a capacitive element are provided.

Figure 1A:
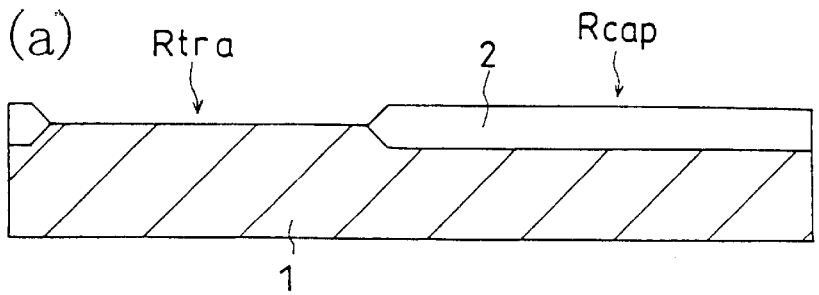
FIGS. 1(a) to 1(d) are sectional views showing the steps performed until the deposition of a second conductive film in the process for manufacturing a semiconductor device in which a MOSFET and a capacitive element are provided according to a first embodiment of the present invention.

For example, a LOCOS isolation 2 which is formed by a LOCOS method is provided on a p well 1 of a silicon substrate as shown in FIG. 1(a). The p well 1 is a region Rtra where a transistor is to be formed, and a portion on the LOCOS isolation 2 is a region Rcap where a capacitive element is to be formed.

Figure 1B:
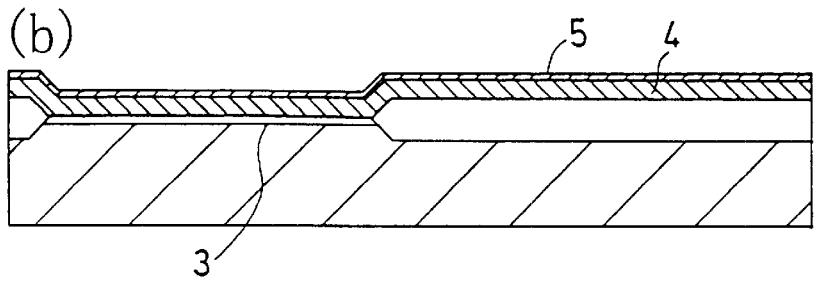

As shown in FIG. 1(b), a gate oxide film 3 is formed on the surface of the silicon substrate of the region Rtra by pyrogenic oxidation in a thickness of 10 nm, for example. Then, polysilicon is deposited in a thickness of 200 nm, for example, and a first conductor film 4 into which an impurity is introduced by a $POCl_3$ diffusion layer is formed. Subsequently, a nitride film 5 which is an insulating film made of a material having a greater capacity per unit area than that of silicon oxide, for example, nitride silicon is deposited on the first conductor film 4 by a CVD method in a thickness of 10 nm.

Figure 1C:
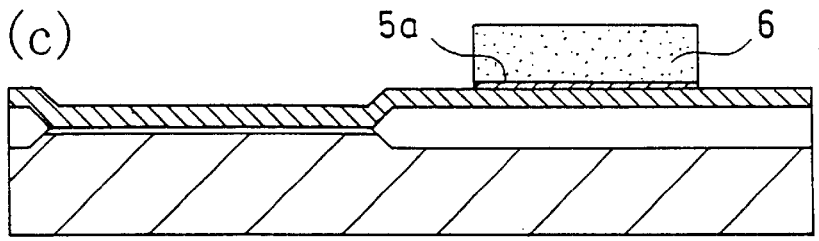

As shown in FIG. 1(c), a resist film 6 is formed to cover at least a portion of the nitride film 5 which should be left as a capacitive film. By using the resist film 6 the nitride film 5 is etched by thermal phosphoric acid so that a capacitive film 5a is formed. At this time, since the resist film 6 is entirely opened in the region Rtra, the nitride film 5 of the region Rtra is wholly removed. At this step, the active region of the semiconductor substrate is also covered with the first conductor film 4. Consequently, it is possible to prevent the generation of the contamination in a semiconductor substrate due to the etching of the nitride film 5.

Figure 1D:
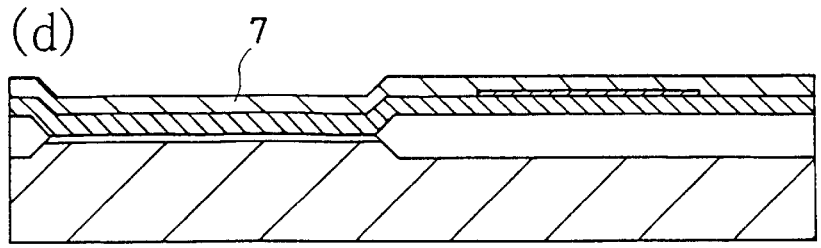

As shown in FIG. 1(d), a second conductor film 7 made of a polysilicon film is deposited on the first conductor film 4 and the capacitive film 5a in almost the same thickness as that of the first conductor film 4. The second conductor film 7 may be made of polycide having a low resistance.

Figure 2A:
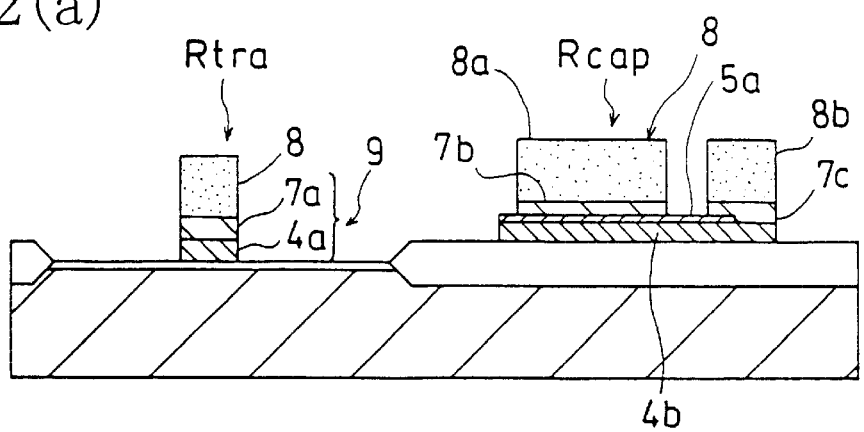
FIGS. 2(a) and 2(b) are sectional views showing the steps performed after patterning first and second conductor films in the process for manufacturing a semiconductor device according to the first embodiment of the present invention.

As shown in FIG. 2(a), a second resist film 8 is formed on the second conductor film 7 so as to cover only a portion to be a gate electrode in the region Rtra and a portion to be a leading electrode made of an upper capacitive electrode and a lower capacitive electrode in the region Rcap. In this case, a second resist film 8 is divided into a first region 8a which covers most of the capacitive film 5a, and a second region 8b which covers a region from the vicinity of the other end of the capacitive film 5a to the first conductor film 5 exposed to the side thereof in the region Rcap. The second resist film 8 and the capacitive film 5a are used as etching masks to perform dry etching on the first conductor film 4 an the second conductor film 7. The second conductor film 7 and the first conductor film 4 are successively etched by the dry etching. Consequently, a lower capacitive electrode 4b and an upper capacitive electrode 7b of a two-layer polysilicon type, and a gate electrode 9 are formed.

Since the nitride film 5 is removed at the prior step in the region Rtra, only the second resist film 8 functions as the etching mask so that a gate portion 4a of the first conductor film and a gate portion 7a of the second conductor film which are provided under the second resist mask 8 are left to form a gate electrode 9 of a transistor. In the region Rcap, the second conductor film covered with the first region 8a of the second resist film 8 is left to be the upper capacitive electrode 7b, the second conductor film covered with the second region 8b of the second resist film 8 is left to be the leading electrode 7c, and the first conductor film 4 covered with the second resist film 8 or the capacitive film 4b is left to be the lower capacitive electrode 4b. The leading electrode 7c is connected to the lower capacitive electrode 4b in a portion on the outside of the capacitive film 5a.

More specifically, only the second resist film 8 functions as the mask for the second conductor film 7 at the dry etching step. Consequently, the upper capacitive electrode 7b and the leading electrode 7c which have the shapes corresponding to the pattern of the second resist film 8 are formed. On the other hand, the second resist film 8 and the capacitive film 5a function as the masks for the first conductor film 4. In other words, the capacitive film 5a functions as an etching stopper in the opening of the second resist film 8. Accordingly, one of ends of the lower capacitive electrode 4b conforms to one of ends of the capacitive film 5a, and the other end of the lower capacitive film 4b conforms to one of ends of the second region 8b of the second resist film 8 in the region Rcap.

Figure 2B:
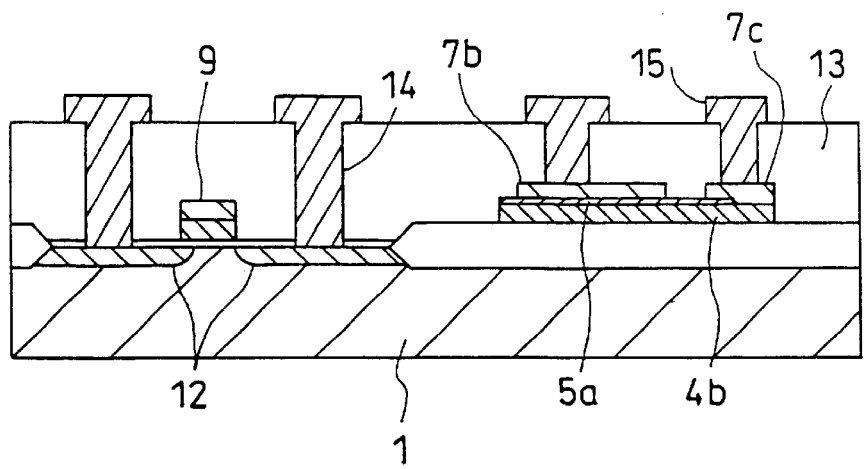

As shown in FIG. 2(b), the second resist film 8 is removed and impurity ions are then implanted into the silicon substrate and the polysilicon film to form a source-drain region 12. At the same time, the resistances of the gate electrode 9, the upper capacitive electrode 7b and the leading electrode 7c are reduced. Thereafter, a layer insulating film 13 is deposited over the whole face to form thereon a contact hole 14 which reaches the source-drain region 12, the upper capacitive electrode 7b and the leading electrode 7c. Subsequently, a metal film is deposited from above to fill in the contact hole 14 and to form a metal wiring layer 15.

The structure of the capacitive film 5a of the capacitive element formed at the manufacturing steps according to the present example is compared with that of the capacitive film according to the prior art. The capacitive film according to the prior art is formed by thermally oxidizing a polysilicon film. For this reason, the capacitive film is an oxide film having a thickness of about 20 nm which is greater than that of the gate oxide film. On the other hand, it is possible to form a nitride film having a thickness of, for example, 10 nm by using the semiconductor device and the method for manufacturing the semiconductor device according to the present invention. Accordingly, the capacitance value per unit area of the capacitive film 5a according to the present example can be increased to about four times as much as that of the capacitive film according to the prior art because the nitride film has a dielectric constant which is about twice as much as that of the oxide film and has a thickness which is about half of that of the oxide film. In other words, the area occupied by the capacitive element of the semiconductor device can be reduced to a quarter of that of the capacitive element according to the prior art.

Table 1 shows the result of comparison of the number of masking steps to be added to the process for manufacturing only a basic transistor and a capacity density (F/cm$^2$) of the capacitive element having the same thickness in the cases where the capacitive film (oxide film) is formed by the two-layer polysilicon process according to the prior art simultaneously with the formation of the gate oxide film, where the capacitive film (nitride film) whose material is different from that of the gate oxide film is formed by the two-layer polysilicon process according to the prior art, and where the capacitive film (nitride film) is formed by the two-layer polysilicon process according to the present embodiment. In Table 1, the above-mentioned effects are shown definitely.

TABLE 1

|  | Prior art (Oxide film) | Prior art (Nitride film) | Present Invention (Nitride film) |
| --- | --- | --- | --- |
| Number of masking step to be added | Once | Twice | Once |
| Capacity density | 10F | 20F | 20F |

While the nitride film has been used as the capacitive film in the first embodiment, the same effects can be obtained also in the case where an oxide film having a smaller thickness than that of the gate oxide film or another high dielectric film materials is applied.

(Second Embodiment)

A method for manufacturing a semiconductor device according to a second embodiment will be described below with reference to FIGS. 3(a) to 3(d) and FIGS. 4(a) to 4(d). FIGS. 3(a) to 3(d) and FIGS. 4(a) to 4(d) are sectional views showing the steps of manufacturing a semiconductor device in which an n-channel transistor and a capacitive element are provided according to the present example. In the present embodiment, the capacitive film of the capacitive element is used as an etching stopper when forming a trench isolation.

Figure 3A:
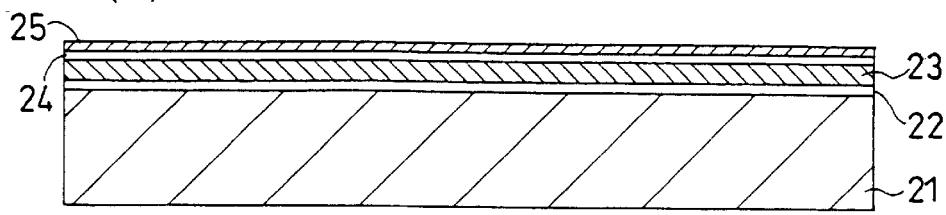
FIGS. 3(a) to 3(d) are sectional views showing the steps performed until the formation of a trench isolation in the process for manufacturing a semiconductor device having a trench isolation structure in which a MOSFET and a capacitive element are provided according to a second embodiment of the present invention.

As shown in FIG. 3(a), an oxide film 22 to be a gate oxide film or the like is formed on a p well 21 of a silicon substrate by pyrogenic oxidation in a thickness of 10 nm, for example. A polysilicon film is deposited in a thickness of 200 nm, and a first conductor film 23 into which an impurity is introduced by a POCl$_3$ diffusion method is then formed. Thereafter, pyrogenic oxidation is performed on the surface portion of the first conductor film 23, for example. Consequently, a silicon oxide film 24 is formed in a thickness of about 10 nm. Subsequently, the surface portion of the silicon oxide film 24 is nitrided by rapid heating (RTA) in an ammonia gas so that a silicon nitride film 25 is formed in a thickness of about 5 nm.

Figure 3B:
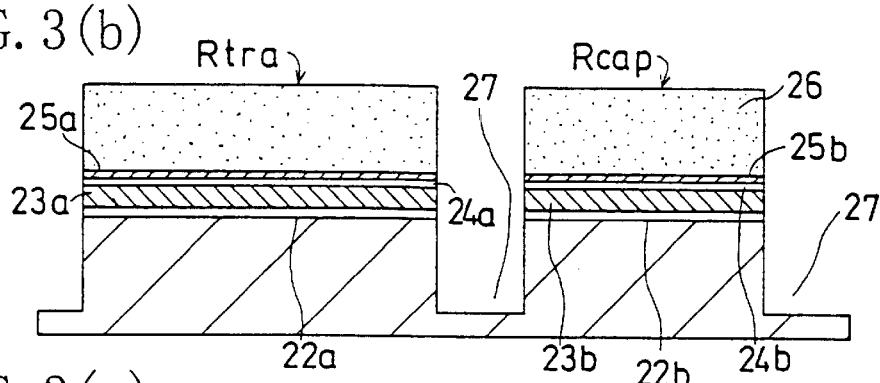

As shown in FIG. 3(b), a part of the silicon nitride film 25, the silicon oxide film 24, the gate oxide film 22 and the p well 21 are removed by a dry etching method by using a first resist film 26 having a desired pattern. Consequently, an element isolating trench 27 is formed. As shown in FIG. 3(b), a region Rtra where a transistor is to be formed is isolated from a region Rcap where a capacitive element-is to be formed by the element isolating trench 27. More specifically, the oxide film 22 is divided into two oxide films 22a and 22b, the first conductor film 23 is divided into two first conductor films 23a and 23b, the silicon oxide film 24 is divided into two silicon oxide films 24a and 24b, and the silicon nitride film 25 is divided into two silicon nitride films 25a and 25b, respectively.

Figure 3C:
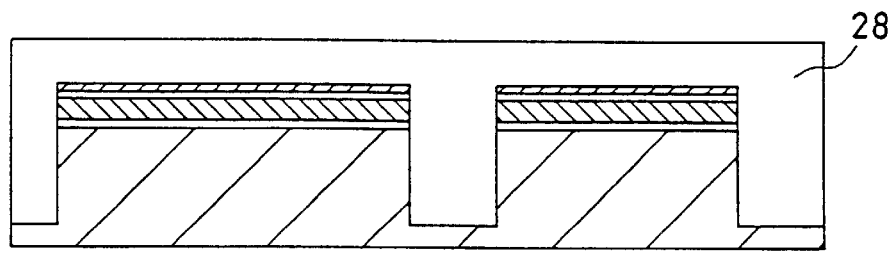

As shown in FIG. 3(c), the first resist film 26 is removed. Then, an insulating film 28 for element isolation which is made of an oxide film is deposited in a thickness of about 500 nm, for example, in the element isolating trench 27 and on the silicon nitride films 25a and 25b. At this time, the element isolating trench 27 is filled in with the oxide film, and the insulating film 28 for element isolation is deposited in a thickness of about 500 nm in other regions.

Figure 3D:
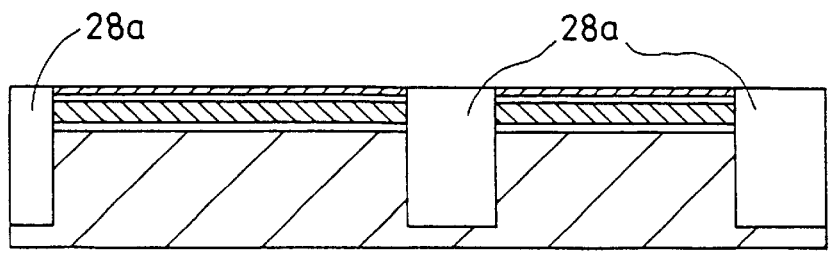

As shown in FIG. 3(d), the insulating film 28 for element isolation is removed so as to finally have the same level as that of the surfaces of the silicon nitride films 25a and 25b by an etchback method. By forming films such as the silicon nitride films 25a and 25b which are made of a material having a high etching selection ratio to the oxide film, a predetermined film thickness can be kept without etching the first conductor films 23a and 23b. However, the silicon nitride films 25a and 25b are slightly etched in some cases. For this reason, the surface portions of the silicon oxide films 24a and 24b are nitrided again so that a capacity can become more stable. At this step, a trench isolation 28a for partitioning semiconductor substrate into a plurality of active regions is formed.

Figure 4A:
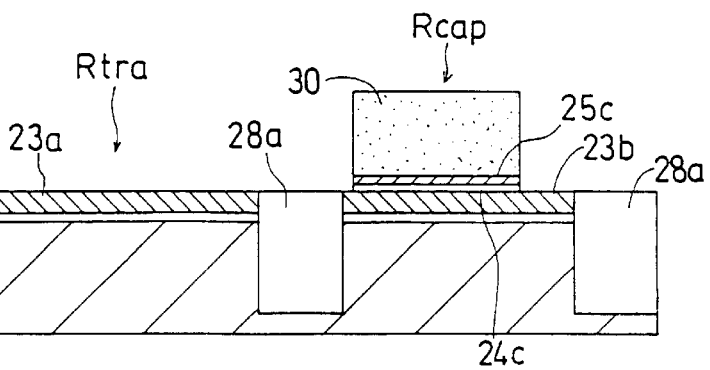
FIGS. 4(a) to 4(d) are sectional views showing the steps performed after a capacitive film is formed by patterning an insulating film in the process for manufacturing a semiconductor device according to the second embodiment of the present invention.

As shown in FIG. 4(a), a second resist film 30 having a desired pattern is formed. The second resist film 30 is opened above the region Rtra and has a pattern which covers only a part of the region Rcap. The second resist film 30 is used to selectively remove the silicon nitride films 25a and 25b made of nitride films by thermal phosphoric acid, for example. Then, wet etching is performed for 20 seconds by using hydrofluoric acid (HF:H$_2$O=1:20) to selectively remove the silicon oxide films 24a and 24b. At this step, the silicon nitride film 25a and the silicon oxide film 24a are wholly removed in the region Rtra, and a part of the silicon nitride film 25b and a part of the silicon oxide film 24b are left in the region Rcap so that a first capacitive film 24c and a second capacitive film 25c are formed. At the same time, the trench isolation 28a is also removed so as to have almost the same level as that of the first conductor films 23a and 23b.

Figure 4B:
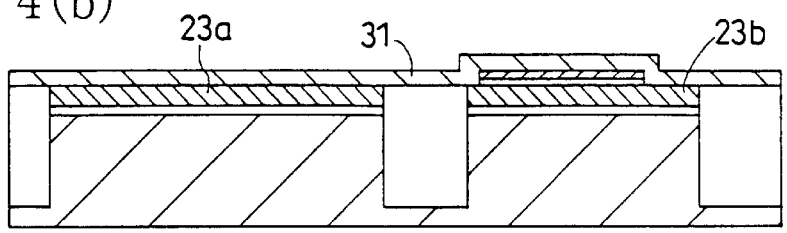

As shown in FIG. 4(b), the second resist film 30 is removed. Then, a second conductor film 31 made of poly- silicon which has almost the same thickness as that of the first conductor film 23 shown in FIG. 3(a) is deposited over the whole face. In this case, polycide having a low resistance may be used for the second conductor film.

Figure 4C:
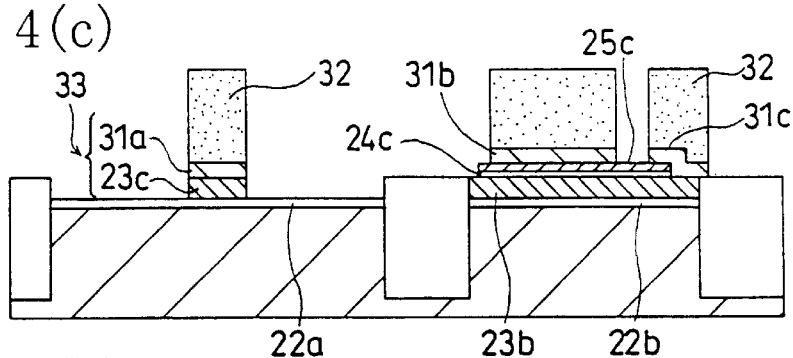

As shown in FIG. 4(c), a third resist film 32 having a desired pattern is formed. The shape of third resist film 32 is basically the same as that of the second resist film 6 according to the first embodiment. In other words, the second conductor film 31 and the first conductor films 23a and 23b are successively etched by a dry etching method by using, as masks, the third resist film 32, the second capacitive film 25c and the first capacitive film 24c. At this step, parts 23c and 31a of the first conductor film 23a and the second conductor film 31 are left to form a gate electrode 33 in the region Rtra. In the region Rcap, the whole first conductor film 23b becomes a lower capacitive electrode and the oxide film 22b becomes the substrate film of the lower capacitive electrode 23b. Consequently, an upper capacitive electrode 31b which is obtained by patterning the second conductor film 31 is formed on the first and second capacitive films 24c and 25c on the lower capacitive electrode 23b, and a leading electrode 31c which is obtained by patterning the second conductor film 31 is formed over the lower capacitive electrode 23b and the first and second capacitive films 24c and 25c. At this time, the first and second capacitive films 24c and 25c function as etching masks (etching stoppers) to effectively prevent a part of the lower capacitive electrode 23b from being removed.

Figure 4D:
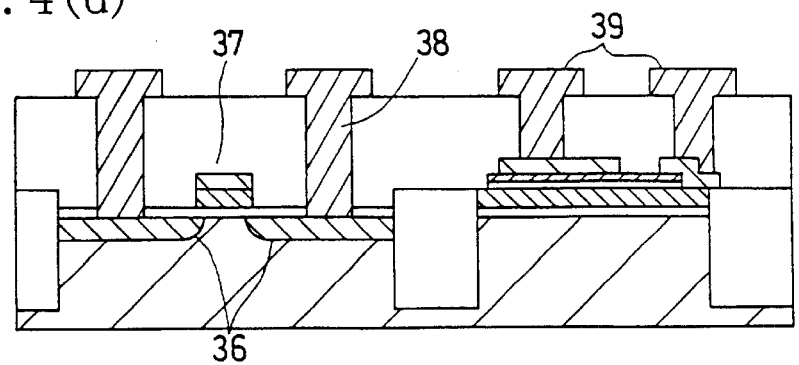

As shown in FIG. 4(d), the same processing as in the step shown in FIG. 2(b) according to the first embodiment is performed to form a source-drain region 36, a layer insulating film 37, a contact hole 38 and a metal wiring layer 39.

According to the present example, a trench isolation structure having the high isolating function is used and the silicon nitride films 25a and 25b function as the etching stoppers at the etchback step shown in FIG. 3(d). Consequently, a predetermined film thickness can be kept without etching the first conductor films 23a and 23b. Therefore, it is possible to control a deterioration in reliability caused by a variation in the film thickness of the gate electrode 33, and a variation in the resistance of a gate wiring. While the silicon nitride films 25a and 25b are wholly removed in a general trench isolation forming method, the silicon nitride film 25b in the region Rcap can be further patterned and used as the second capacitive film 25c of the capacitive element in the present example. Thus, an increase in the steps can be prevented effectively.

(Third Embodiment)

A third embodiment in which an EEPROM cell is formed in addition to a MOS transistor and a capacitive element will be described below. FIGS. 5(a) to 5(d) and FIGS. 6(a) to 6(d) are sectional views showing the steps of manufacturing a semiconductor device according to the present embodiment.

Figure 5A:
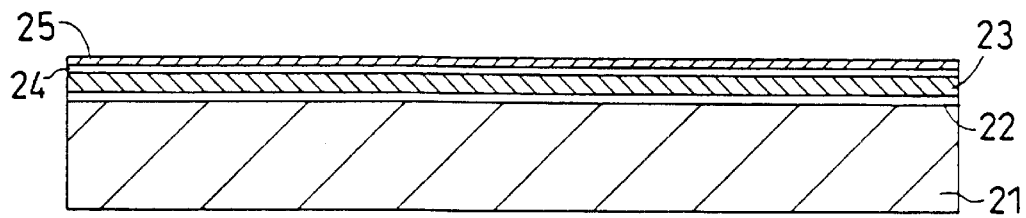
FIGS. 5(a) to 5(d) are sectional views showing the steps performed until the formation of a trench isolation in the process for manufacturing a semiconductor device in which a MOSFET, an EEPROM memory cell and a capacitive element are provided according to a third embodiment of the present invention.
Figure 5B:
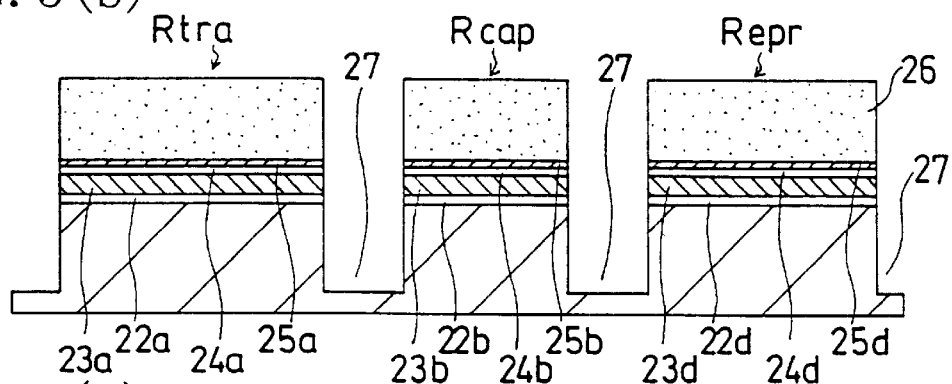

As shown in FIG. 5(a), the same processing as in FIG. 3(a) according to the second embodiment is performed to sequentially form an oxide film 22, a first conductor film 23, a silicon oxide film 24 and a silicon nitride film 25 on a p well 21 of a silicon substrate. Then, an element isolating trench 27 is formed by using a first resist film 26 having a desired pattern as shown in FIG. 5(b). Differently from the second embodiment, the p well 21 is partitioned into a region Rtra where a transistor is to be formed, a region Rcap where a capacitive element is to be formed, and a region Rpr where an EEPROM is to be formed by the element isolating trench 27 in the present embodiment.

At the steps shown in FIGS. 5(c) and 5(d) and FIGS. 6(a) to 6(d), the processing in the regions Rtra and Rcap are performed similarly to the second embodiment. Accordingly, the processing in the region Repr will mainly be described below.

At the step shown in FIG. 5(b), the oxide film 22, the first conductor film 23, the silicon oxide film 24 and the silicon nitride film 25 are divided into three oxide films 22a, 22b and 22d, three first conductor films 23a, 23b and 23d, three silicon oxide films 24a, 24b and 24d, and three silicon nitride films 25a, 25b and 25d by the element isolating trench 27, respectively.

Figure 5C:
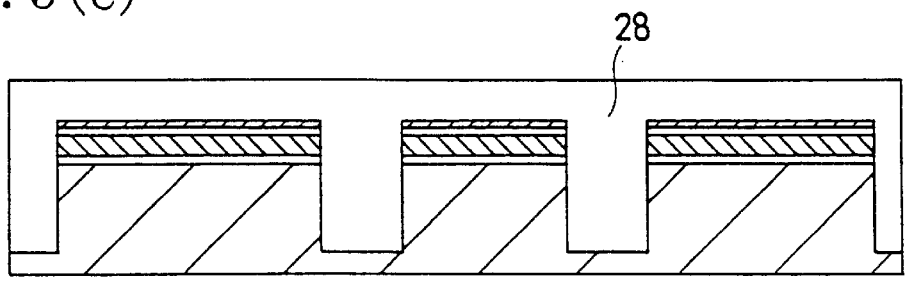

As shown in FIG. 5(c), the first resist film 26 is removed. Then, an insulating film 28 for element isolation which is made of an oxide film is deposited in a thickness of about 500 nm, for example, in the element isolating trench 27 and on the silicon nitride films 25a, 25b and 25d. At this time, the element isolating trench 27 is filled in with the oxide film, and the insulating film 28 for element isolation is deposited in a thickness of about 500 nm in other regions.

Figure 5D:
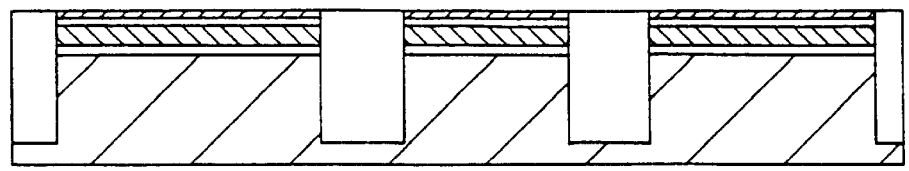

As shown in FIG. 5(d), the insulating film 28 for element isolation is removed so as to finally have the same level as that of the surfaces of the silicon nitride films 25a, 25b and 25d by an etchback method. At this step, trench isolations 28a which are isolated from each other are formed.

Figure 6A:
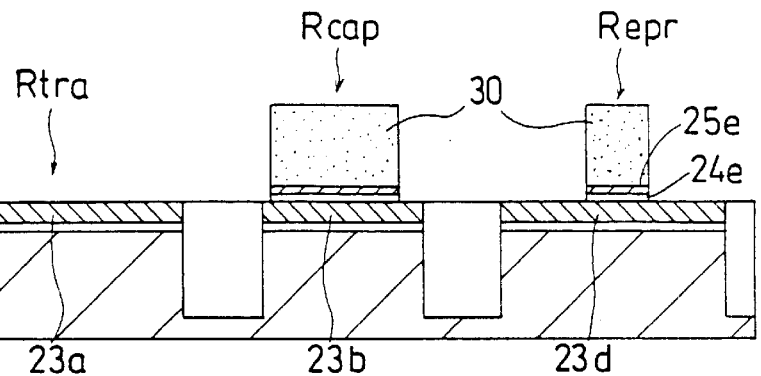
FIGS. 6(a) to 6(d) are sectional views showing the steps performed after a capacitive film is formed by patterning an insulating film in the process for manufacturing a semiconductor device according to the third embodiment of the present invention.

As shown in FIG. 6(a), a second resist film 30 having a desired pattern is formed. The second resist film 30 is opened above the region Rtra, and has a pattern which covers only a part of the regions Rcap and Repr. The same etching as in the second embodiment is performed by using the second resist film 30 so that the silicon nitride film 25a and the silicon oxide film 24a are wholly removed in the region Rtra, a part of the silicon nitride film 25b and a part of the silicon oxide film 24b are left to be a first capacitive film 24c and a second capacitive film 25c in the region Rcap, and insulating films 24e and 25e on first and second gates are formed by patterning the silicon oxide film 24d and the silicon nitride film 25d in the region Repr.

Figure 6B:
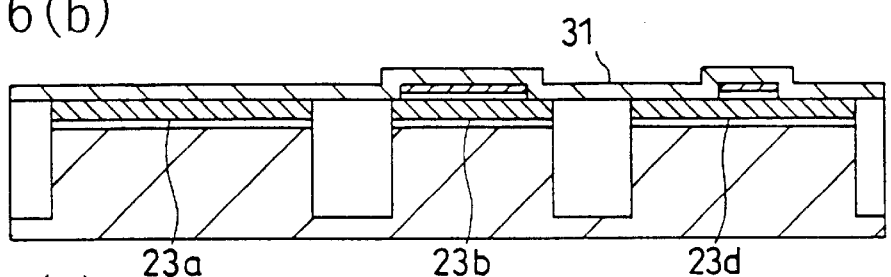

As shown in FIG. 6(b), the second resist film 30 is removed. Then, a second conductor film 31 which has the same thickness as that of the first conductor film 23 and is made of the same material (polysilicon) as that of the first conductor film 23 shown in FIG. 3(a) is deposited over the whole face.

Figure 6C:
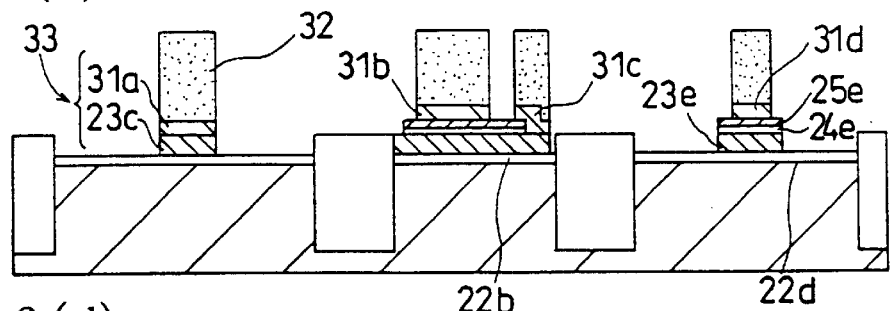

As shown in FIG. 6(c), a third resist film 32 having a desired pattern is formed. The shape of the third resist film 32 is the same as that of the second resist film 6 according to the second embodiment in the regions Rtra and Rcap. In the region Repr, the third resist film 32 is formed so as to cover a part of the insulating films on first and second gates. Dry etching is performed by using the third resist film 32 so that a gate electrode 33 is formed in the region Rtra in the same manner as in the second embodiment, and a lower capacitive electrode 23b, a substrate film 22b, an upper capacitive electrode 31b and a leading electrode 31c are formed in the region Rcap in the same manner as in the second embodiment. A floating gate electrode 23e which is obtained by patterning the first conductor film 24d, a substrate film 22d, insulating films 24e and 25e on the first and second gates which are obtained by patterning the silicon oxide film 24 and the silicon nitride film 25d, and a control gate electrode 31d which is obtained by patterning the second conductor film 31 are formed in the region Repr. The oxide film 22d functions as a gate oxide film of an EEPROM cell transistor. In this case, the first and second capacitive films 24c and 25c function as etching masks when forming the floating gate electrode 23e.

Figure 6D:
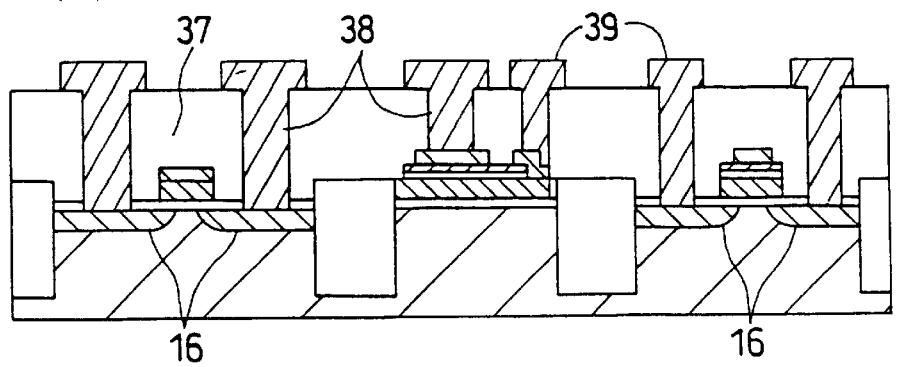

As shown in FIG. 6(d), the same processing as in the step shown in FIG. 2(b) according to the first embodiment is performed to form a source-drain region 16, a layer insulating film 37, a contact hole 38 and a metal wiring layer 39.

According to the present example, there is an advantage that the EEPROM can also be formed in addition to the same effects obtained in the second embodiment.

(Fourth Embodiment)

A fourth embodiment in which a transistor and a resistive element are simultaneously provided will be described below. FIGS. 7(a) to 7(d) are sectional views showing the steps of manufacturing a semiconductor device according to the present example. In the present embodiment, the first conductor film according to the second embodiment is used as a resistive film.

Also in the present embodiment, the steps which are identical to those shown in FIGS. 3(a) to 3(d) according to the second embodiment are performed, whose description will be omitted. Then, the step shown in FIG. 7(a) is performed.

Figure 7A:
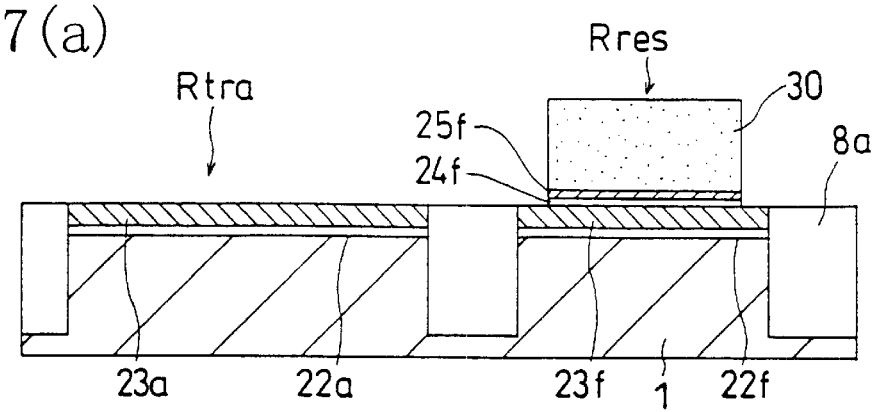
FIGS. 7(a) to 7(d) are sectional views showing the steps performed after forming a trench isolation in the process for manufacturing a semiconductor device having a trench isolation structure in which a MOSFET and a resistive element are provided according to a fourth embodiment of the present invention.

At the step shown in FIG. 7(a), a second resist film 30 having a desired pattern is used as a mask to selectively etch a silicon nitride film and a silicon oxide film by thermal phosphoric acid, for example (the conditions for etching are the same as in the second embodiment). In the present example, the second resist film 30 covers only a part of a region Rres where a resistive element is to be formed. While a silicon oxide film 24a and a silicon nitride film 25a in a region Rtra where a transistor is to be formed are wholly removed, first and second protection films 24f and 25f are formed in the region Rres. In that case, the surface of a first conductor film 23f is exposed with a sufficient space on both sides of the protection films 24f and 25f.

Figure 7B:
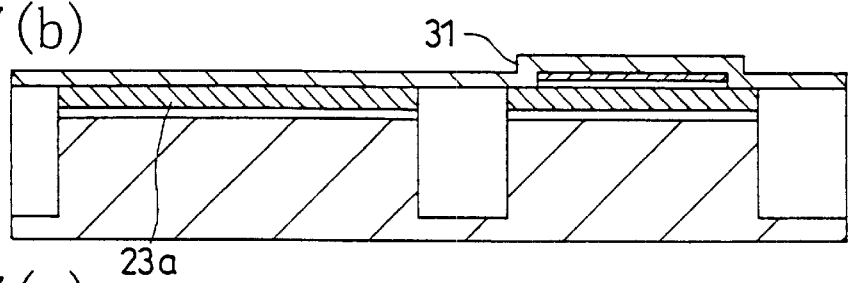

As shown in FIG. 7(b), the second resist film 30 is removed. Then, a second conductor film 31 which has the same thickness as that of the first conductor film 23 shown in FIG. 3(a) and is made of the same material (polysilicon) as that of the first conductor film 23 is deposited over the whole face. The second conductor film 31 is deposited in the same manner as the first conductor film 23. In this case, polycide having a low resistance may be used as the second conductor film 31.

Figure 7C:
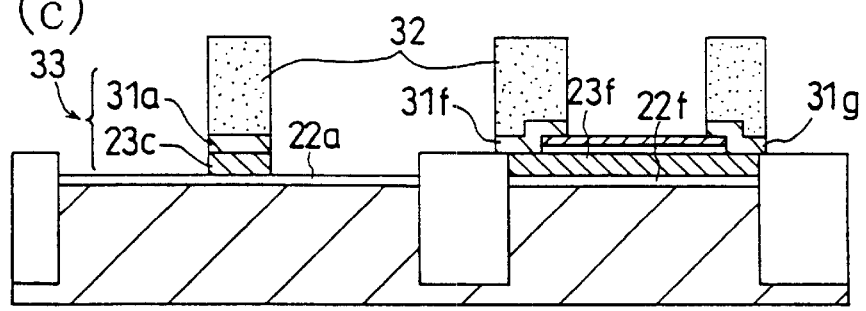

As shown in FIG. 7(c), a third resist film 32 having a desired pattern is formed. The shape of the third resist film 32 is the same as in the second embodiment in the region Rtra, and is different from that in the second embodiment in the region Rres. In the region Rres, the third resist film 32 is divided. into two parts which cover a region from both ends of the protection films 24f and 25f to the first conductor film 23f on the side thereof, respectively. By using the third resist film 32 and the protection films 24f and 25f as masks, the second conductor film 31 and the first conductor film 23a are successively etched by a dry etching method. At this step, parts 23c and 31a of the first conductor film 23a and the second conductor film 31 are left to form a gate electrode 33 in the region Rtra. In a region Rres where a resistive element is to be formed, the whole first conductor film 23f becomes a resistive film having a comparatively high resistance and an oxide film 22f becomes the substrate film of the resistive film 23f. Two leading electrodes 31f and 31g are formed on the resistive film 23f and the first and second protection films 24f and 25f by patterning the second conductor film 31. At this time, the first and second protection films 24f and 25f function as etching masks (etching stoppers) to effectively prevent a part of the resistive film 23f from being removed.

Figure 7D:
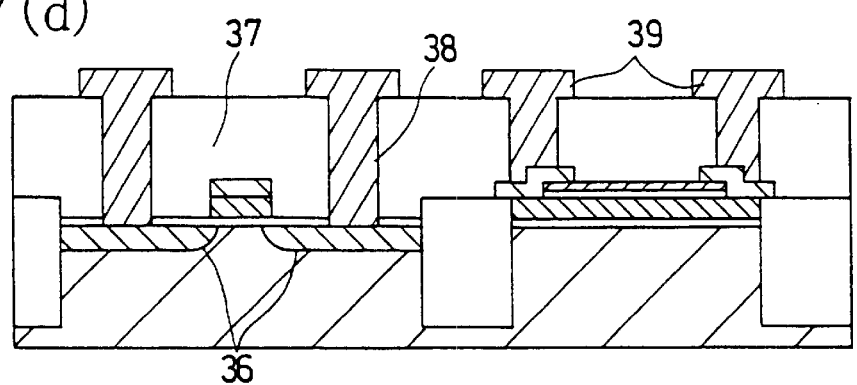

As shown in FIG. 7(d), the same processing as in FIG. 2(b) according to the first embodiment is performed to form a source-drain region 36, a layer insulating film 37, a contact hole 38 and a metal wiring layer 39.

In the present embodiment, the resistive film 23f of the resistive element is made of a polysilicon film which is common to the lower layer 23c of the gate electrode 33 of a MOS transistor. In that case, an upper layer 31a is laminated in the gate electrode 33. Consequently, if the upper layer 31a has a low resistance, the lower layer 23c can have a high resistance. Accordingly, the resistive film 23f of the resistive element can be made of a material which has a comparatively high resistance so that the area occupied by the resistive element can be reduced.

In the same manner as in the second embodiment, a trench isolation structure having the high isolating function is used and the silicon nitride film functions as the etching stopper at the etchback step. Consequently, a predetermined film thickness can be kept without etching the first conductor film. Therefore, it is possible to control a deterioration in reliability caused by a variation in the film thickness of the gate electrode 33, and a variation in the resistance of a gate wiring. In a general trench isolation forming method, the silicon nitride film is wholly removed. In the present example, the silicon nitride film 25f in the region Rres can be used as the etching stopper for the resistive film 23f when patterning the leading electrodes 31f and 31g. Consequently, an increase in the steps can be prevented effectively.

The gate electrode 33 has the lamination structure of the conductor films 23c and 31a. For this reason, a conductor film having a low resistance (sheet resistance of 5 to 10 Ω/□) such as polycide which is obtained by a lamination of polysilicon and silicide may be used in such a manner that the second conductor film 31 which acts as the upper layer can also be utilized as a local wiring. In this case, the resistive element is the first conductor film 23 formed of a conductor film (sheet resistance of 30 to 100 Ω/□) which is obtained by introducing an impurity into polysilicon by a POCl$_3$ diffusion method or an ion implantation method. Consequently, the area of the resistive element is not increased.

(Other Embodiments)

In the second, third and fourth embodiments, the capacitive film and the protection film have been formed by the lamination structure of the silicon nitride film and the silicon oxide film. Also in the case where a nitride film single layer of the gate oxide film and other high dielectric film materials can be applied, the same effects can be obtained.

While the n-channel transistor has been formed in the region Rtra in the embodiments described above, it is apparent that the n-channel transistor and the p-channel transistor can be formed together or that a bipolar transistor can be formed.

Furthermore, it is also possible to manufacture a semiconductor device in which the capacitive element and the resistive element are provided together or the transistor, the capacitive element and the resistive element are provided together by using the same steps as in the above-mentioned embodiments.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

We claim:

1. A semiconductor device in which at least a MIS transistor and a capacitive element are provided on a semiconductor substrate, the MIS transistor including at least:

a gate insulating film formed on the semiconductor substrate; and a gate electrode formed of a first conductor film and a second conductor film which are laminated on the gate insulating film, the capacitive element including:

a lower capacitive electrode formed of the first conductor film;

a capacitive film formed on the lower capacitive electrode and made of an insulating film whose material is different from that of the gate insulating film; and an upper capacitive electrode formed on the capacitive film and made of the second conductor film, said upper capacitive electrode formed directly on said capacitive film.

2. The semiconductor device of claim 1, further comprising a resistive element, the resistive element including:

a resistive film made of the first conductor film;

an etching protection film formed on the resistive film and made of an insulating film which is common to the capacitive film of the capacitive element; and two leading electrodes formed over a portion from both ends of the etching protection film to the resistive film on the outside thereof, and made of the second conductor film.

3. The semiconductor device of claim 1, wherein the first conductor film is made of a polysilicon film.

4. The semiconductor device of claim 1, wherein the insulating film is made of at least one of a silicon nitride film, PZT and a tantalum oxide film.

5. The semiconductor device of claim 1, further comprising an EEPROM memory cell, the EEPROM memory cell including:

a floating gate electrode formed of the first conductor film;

an insulating film on a floating gate made of the insulating film; and a control gate electrode formed on the insulating film on the floating gate, and made of the second conductor film.

6. A semiconductor device in which at least a MIS transistor and a resistive element are provided on a semiconductor substrate, the MIS transistor including at least:

a gate insulating film formed on the semiconductor substrate; and a gate electrode formed of a first conductor film and a second conductor film which are laminated on the gate insulating film, the resistive element including:

a resistive film made of the first conductor film;

an etching protection film formed in a region other than both ends of the resistive film and made of an insulating film whose material is different from that of the gate insulating film; and two leading electrodes formed over a portion from both ends of the etching protection film to the resistive film on the outside thereof, and made of the second conductor film.

7. The semiconductor device of claim 6, wherein the insulating film is made of at least one of a silicon nitride film, PZT and a tantalum oxide film.

8. A semiconductor device in which at least a capacitive element and a resistive element are provided on a semiconductor substrate, the capacitive element including:
- a lower capacitive electrode formed on the semiconductor substrate and made of a first conductor film;
- a capacitive film formed on the lower capacitive electrode and made of an insulating film; and
- an upper capacitive electrode formed on the capacitive film and made of the second conductor film, the resistive element including:
- a resistive film made of the first conductor film;
- an etching protection film formed on the resistive film and made of an insulating film which is common to the capacitive film of the capacitive element; and
- two leading electrodes formed over a portion from both ends of the etching protection film to the resistive film on the outside thereof, and made of the second conductor film.

9. The semiconductor device of claim 8, wherein the insulating film is made of at least one of a silicon nitride film, PZT and a tantalum oxide film.

10. The semiconductor device of claim 8, further comprising an EEPROM memory cell, the EEPROM memory cell including:
- a floating gate electrode formed of the first conductor film;
- an insulating film on a floating gate made of the insulating film; and
- a control gate electrode formed on the insulating film on the floating gate, and made of the second conductor film.

11. A semiconductor device in which at least a MIS transistor and a capacitive element are provided on a semiconductor substrate, the MIS transistor including at least:
- a gate insulating film formed on the semiconductor substrate; and
- a gate electrode formed of a first conductor film and a second conductor film which are laminated on the gate insulating film, the capacitive element including:
- a lower capacitive electrode formed of the first conductor film;
- a capacitive film formed on the lower capacitive electrode and made of an insulating film whose material is different from that of the gate insulating film; and
- an upper capacitive electrode formed on the capacitive film and made of the second conductor film, said semiconductor device further comprising a resistive element, the resistive element including:
- a resistive film made of the first conductor film;
- an etching protection film formed on the resistive film and made of an insulating film which is common to the capacitive film of the capacitive element; and
- two leading electrodes formed over a portion of both ends of the etching protection film and the resistive film, and made of the second conductor film.

* * * * *

UNITED STATES PATENT AND TRADEMARK OFFICE
CERTIFICATE OF CORRECTION

PATENT NO. : 6,492,672 B1
DATED : December 10, 2002
INVENTOR(S) : Mizuki Segawa et al.

It is certified that error appears in the above-identified patent and that said Letters Patent is hereby corrected as shown below:

Title page,
Item [*] Notice, "Subject to any disclaimer, the term of this patent is extended or adjusted under 35 U.S.C. 154(b) by 66 days" should read -- Subject to any disclaimer, the term of this patent is extended or adjusted under 35 U.S.C. 154(b) by 37 days. --.

Signed and Sealed this

Sixth Day of September, 2005

JON W. DUDAS
*Director of the United States Patent and Trademark Office*